ELECTRONIC CLOCK UTILIZING OSCILLATOR TO SWITCH BISTABLE CIRCUIT AT SUBHARMONIC OF OSCILLATOR FREQUENCY

Filed Aug. 12, 1963 3 Sheets-Sheet 1

WALTER D. ENGELHARDT
CARMINE A. MASTER
INVENTORS
BY John R. Faulkner
Stuart Lubitz
ATTORNEYS

WALTER D. ENGELHARDT
CARMINE A. MASTER
INVENTOR

BY John R. Faulkner
Stuart Lubitz
ATTORNEYS

WALTER D. ENGELHARDT
CARMINE A. MASTER
INVENTORS

BY John B. Faulkner
Stuart Lubitz
ATTORNEYS 3,250,066

ELECTRONIC CLOCK UTILIZING OSCILLATOR TO SWITCH BISTABLE CIRCUIT AT SUBHARMONIC OF OSCILLATOR FREQUENCY

Walter D. Engelhardt, Costa Mesa, and Carmine A. Master, Orange, Calif., assignors, by mesne assignments, to Philco Corporation, a corporation of Delaware Filed Aug. 12, 1963, Ser. No. 301,475
9 Claims. (Cl. 58—23)

This invention relates to an electronic clock. More particularly, this invention relates to an electronic clock that may be utilized in extreme environmental conditions without affecting operability or accuracy.

The prior art, such as U.S. Patent 2,971,323 issued to M. Hetzel on February 14, 1961 and British Patent 761, 609 issued to the Bulova Watch Company on November 14, 1956, teach an electronic wrist watch incorporating a tuning fork, an electronic oscillator and a pawl connected to the tuning fork. The pawl is vibrated with the tuning fork to drive a gear mechanism attached to the hands of the wrist watch. This type of construction is not adapted to withstand environmental conditions involving extreme vibrations such as exist in an automotive vehicle, extreme temperature changes ranging from −20° F. to +150° F. and voltage input variations ranging from 8 to 16.5 volts D.C. Further, in clock constructions, as contrasted with wrist watches, a motor or some other power means is necessary to drive the large loads presented by the clock hands and the cooperating gear train. In order to energize a motor or power means, a properly formed, relatively constant wave form must be supplied by the associated electronic circuitry. These pulse requirements could not be readily met by the prior art wrist watch oscillator circuits.

To meet the above-discussed extreme environmental conditions, load conditions and pulse requirements, a unique electronic clock combination has been invented comprising a transisitorized tuning fork oscillator that is connected to a bistable transistorized electronic switch. The bistable electronic switch is in turn connected to a synchronous hysteresis motor that drives the hands of the clock via a gear train.

The invented electronic clock has been tested at temperatures of −20° F. to +150° F. with input voltages varying from 8 to 16 volts D.C. Under these conditions the clock experienced a maximum error of 40 seconds per day. This performance can be fully appreciated only when it is compared with that of present automotive vehicle clocks wherein an error of 1.5 minutes per day is not uncommon. In addition to this increase in accuracy, the invented eletcronic clock may be manufactured at substantially the same cost as present electric clocks and, because of the elimination of the tranditional escapement and pendulum mechanism, it is substantially more reliable.

The full significance of the invention will be appreciated when the detailed written description is read in conjunction with the drawings wherein.

Figure 1:
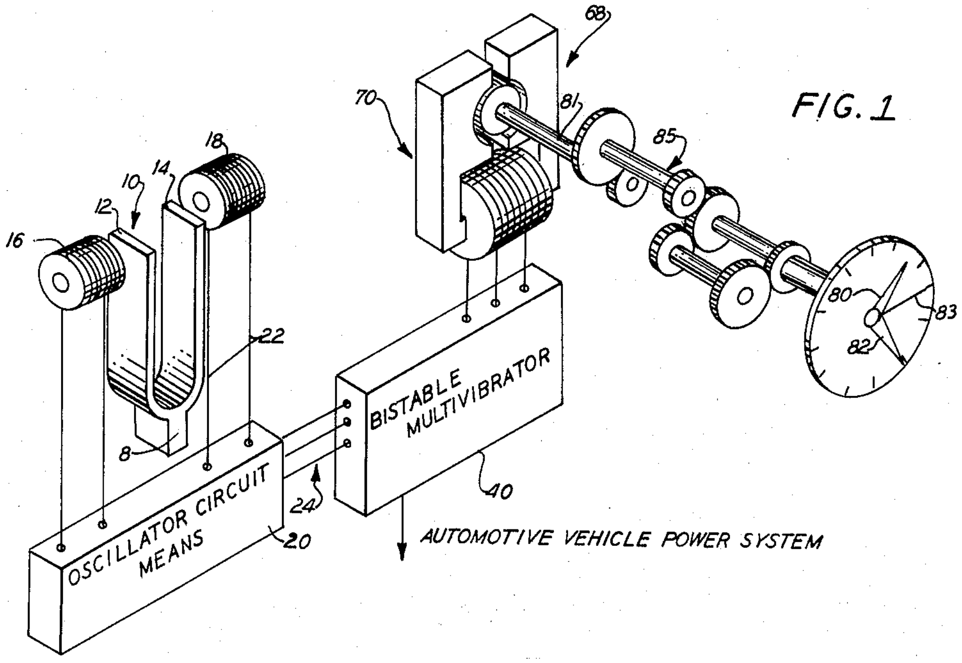
FIGURE 1 is a schematic diagram of the electronic clock combination.

Referring to FIGURE 1, the electronic clock assembly includes an oscillator means 20 connected to a bistable electronic multivibrator or switch means 40 and a drive means 68 for rotating the clock hands 80, 82 and 83. The drive means 68 includes a motor 70 and a gear train 85. The oscillator means 20 controls the bistable switch means 40 which in turn energizes the motor 70 to rotate the gear train 85 at a constant speed.

Figure 2:
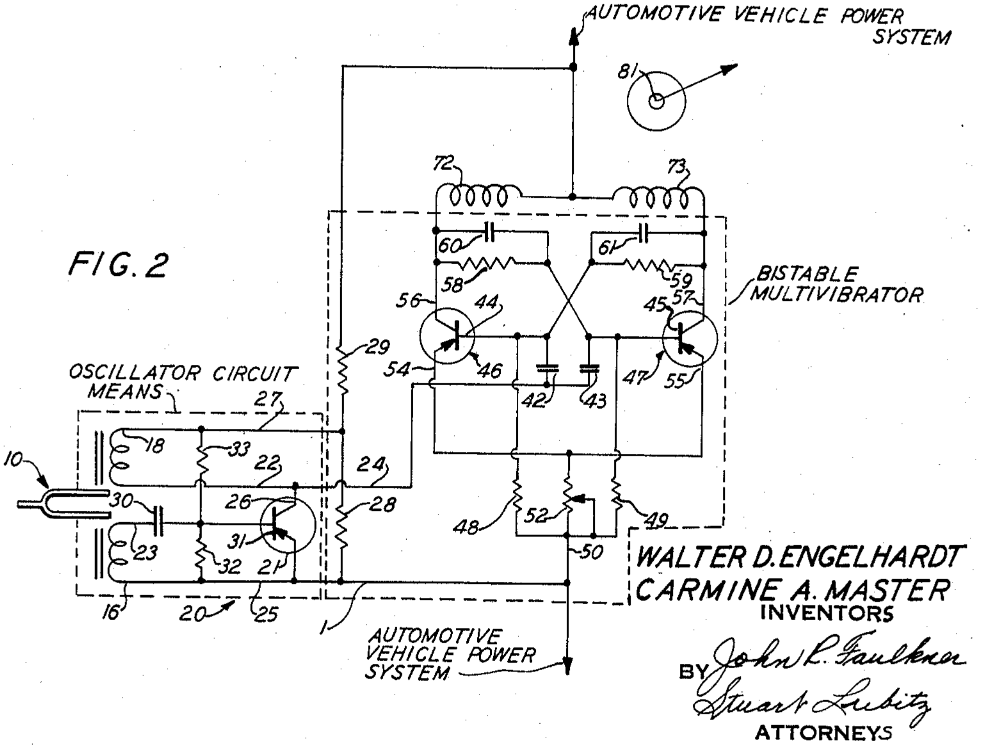
FIGURE 2 is an electrical schematic diagram of the oscillator means, bistable switch means and motor utilized in the clock.
Figure 5:
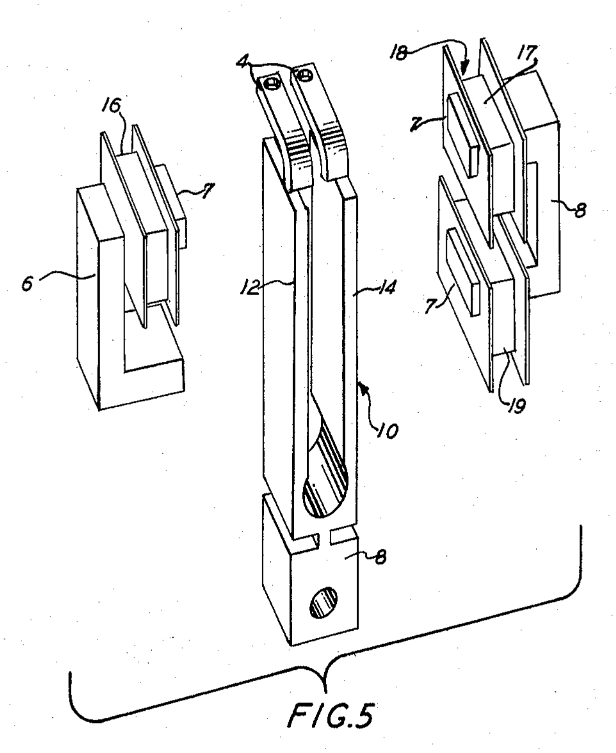
FIGURE 5 is a perspective drawing of the tuning fork utilized in the invented clock.

Referring more specifically to FIGURES 1, 2 and 5, the oscillator means 20 includes a tuning fork assembly 10 which comprises a tuning fork 8 having tines 12 and 14. A sensing coil 16 is located adjacent the tine 12 while a drive coil 18 is located adjacent the tine 14. The sensing coil 16 develops a voltage related to variations of the magnetic flux thorugh the low reluctance core 6. The frequency of these voltage variations developed by the sensing coil 16 is in turn controlled by the rate of vibrations of the tuning fork 8. The tuning fork 8 is designed to vibrate at 360 c.p.s., but may be designed to have substantially any desired resonant frequency.

The emitter-base circuit of the transistor 21 is connected to the sensing coil 16 by the conductors 23 and 25 and a R-C coupling circuit comprising a blocking capacitor 30 which couples the A.C. signal of the coil 16 to the base 21 and a return-bias resistor 32. These types of coupling circuits are well known in the art and explained in detail in such texts as Basic Theory and Application of Transistors published by Headquarters Department of the Army in March 1959, pages 96 and 118. The emitter of transistor 21 is also connected to the vehicle power source by a conductor 1. The resistor 32 cooperates with a bias resistor 33 to form a bias and amplitude stabilizing circuit for the transistor 21 throughout a substantial range of temperature and input voltage variation. This structure enables the voltage variations developed in the sensing coil 16 to be transmitted to the transistor 21 to cause it to oscillate.

The transistor collector 26 is connected to a conductor 22 to form one output of the transistor 21. This conductor 22 is connected to the drive coil 18 that in turn is connected by the conductor 27 to a voltage divider circuit comprising resistors 28 and 29. These resistors function as a voltage divider circuit which supplies the oscillator circuit 20 over the entire input voltage range. In an automotive vehicle this may be between 8 and 16.5 volts. The resistor 28 may have a thermistor connected in parallel with it to compensate for temperature variations. The current that passes from collector 26 to the coil 18 causes a magnetic force to be exerted upon the tine 14 which maintains the tuning fork 8 at its resonant frequency. It can be seen that the conductor 22, drive coil 18, the tuning fork 8, the sensing coil 16 and the conductor 23 form the feedback portion of the oscillator means 20 which maintains the operation of the oscillator at a constant frequency.

The drive coil 18 is specifically shown in FIGURE 5 and includes two coils 17 and 19 that are connected in series. The coils 17 and 19 are wound around an Alinco-V C-shaped core 7 and they may be made from 3,950 turns of No. 42 wire and 4,850 turns of No. 42 wire respectively. The sensing coil 16 comprises 3,950 turns of No. 42 wire wound around one legt of a similar C-shaped core 6.

The tuning fork associated with these coils 16 and 17 is of the type described in U.S. Patent 2,732,748 issued to B. F. Grib on January 31, 1956. This type of tuning fork includes a pair of bimetal members 4 that are attached to the tines 12 and 14 of the tuning fork 8. These bimetal members are adapted to receive additional solder at their ends so that the calibration of the tuning fork is possible. The bimetal members will compensate for temperature variations. The tuning fork may be made from cold rolled stress relieved Invar or the equivalent with the Brinell hardness of 185. It is within the scope of the invention to eliminate the bimetal members 4. With the bimetal members 4 removed, it is still possible to attain accuracies with less than 0.1 percent error at 80° F. temperature variations.

Typically, the circuit components of the oscillator circuit means 20, described above, may be made from the following components:

| Component | Value |
|---|---|
| Transistor 21 | Germanium transistor type TI-2N404A. |
| Return-bias resistor 32 | 10,000 ohms, 0.5 watt. |
| Bias resitor 33 | 200,000 ohms, 0.5 watt. |
| Blocking capacitor 30 | 0.1 microfarad, 50 volts. |
| Resistor 28 | 500 ohms, 0.5 watt. |
| Resistor 29 | 150 ohms, 0.5 watt. |

Figure 3:
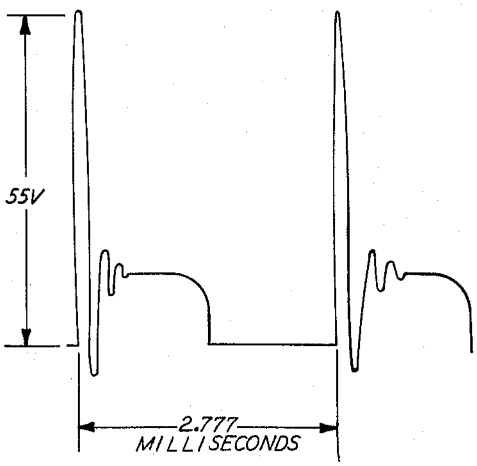
FIGURE 3 is a graph showing the pulse form generated by the oscillator means.

The above-specified oscillator circuit means 20 has an output that is characterized by the wave form shown in FIGURE 3 and oscillates at the rate of 360 c.p.s.

In operation the oscillator circuit means 20 is self-starting and its frequency is primarily controlled by the physical constants of the frequency standard or tuning fork 8. The vibration of the tuning fork 10 induces a voltage in the sensing coil 16 which in turn biases the transistor 21 to a conductive or nonconductive state depending on the coil construction, the particular transistor and the biasing arrangement. The switching of the transistor 21 causes a voltage to be periodically applied to the drive coil 18 that in turn maintains the vibration of the tuning fork 8 at a substantially constant frequency. This constant vibrating of the tuning fork 8 in turn induces a voltage in the sensing coil 16.

The oscillator circuit means 20 is also connected to the bistable switch or multivibrator circuit means 40 by the conductor 24. The bistable switch means 40 switches from one state to another after a given number of oscillations of the oscillator circuit means 20. More particularly, the bistable switch means 40 is a high gain germanium switch constructed to be switched at the sixth subharmonic of the oscillator means 20 or at the rate of 60 c.p.s. The switching of the bistable switch means or multivibrator at the rate of 60 c.p.s. is unusual as bistable multivibrators are generally operated at much higher frequencies and are not generally known to be constructed to switch at the subharmonic frequency of an oscillator. The bistable switch means 40 has the additional attributes of having its operating characteristics substantially independent of the motor field resistance variations due to self-heating or applied environment and it also generates a voltage wave form that is adapted to reliably operate a motor.

Referring to FIGURE 2, the conductor 24, which functions as the input conductor to the bistable switch means 40, is connected to a pair of coupling capacitors 42 and 43. The coupling capacitor 42 is connected to the base 44 of a germanium transistor 46 while the coupling capacitor 43 is connected to the base 45 of a germanium transistor 47. The base 44 is also connected to a bias and stabilizing resistor 48 while the base 45 is connected to a bias and stabilizing resistor 49. The resistors 48 and 49 are in turn connected to the power system of the automotive vehicle by the conductor 50. The resistors 48 and 49 provide bias and amplitude stabilization over a range of voltage input and temperature variations. A resistor 52 is connected to the emitters 54 and 55 to provide additional emitter stabilization. The resistor 52 may be a variable or adjustable resistor so that it is possible to compensate for normal production tolerances. The collector 56 of the transistor 46 is connected to the base 45 of the transistor 47 via a parallel R-C circuit comprising the resistor 58 and the commutative capacitor 60. The collector 57 of the transistor 47 is connected to the base 44 of the transistor 46 by a similar R-C parallel circuit comprising the resistor 59 and the commutative capacitor 61. The output of the collectors 56 and 57 are also connected to the split field motor winding comprising windings 72 and 73 of the hysteresis synchronous motor 70.

The hysteresis synchronous motor has an 18 pole-stator configuration and is wound with 1,516 turns of No. 32 enameled wire to form the split field 72, 73. The energization of the split field 72, 73 by the bistable switch means 40 causes the motor to rotate at a synchronous speed of 400 r.p.m. which is determined by the 60 c.p.s. switching rate of the bistable switch means 40 and the 18 pole-stator configuration.

The above-described bistable switch circuit means may be constructed from the following components:

| Components | Values |
|---|---|
| Bias resistors 48 and 49 | 2,500 ohms, 0.5 watt. |
| Resistor 52 | 20 ohms, 0.5 watt. |
| Transistors 46 and 47 | Germanium TI-368. |
| Capacitors 42 and 43 | 0.1 microfarad, 50 volts. |
| Resistors 58 and 59 | 1,200 ohms, 0.5 watt. |
| Capacitors 60 and 61 | 1.0 microfarad, 50 volts. |

Figure 4:
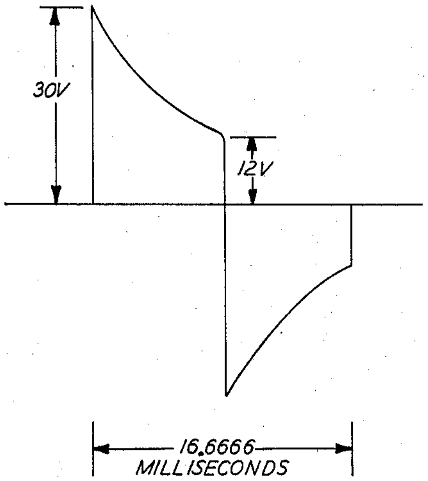
FIGURE 4 is a graph showing the pulse form generated by the bistable switch means.

In operation the bistable switch or multivibrator 40 is energized by the oscillator circuit means 20. The values of the capacitors 60 and 61 and the resistors 58 and 59 are selected so that the oscillation rate of 360 c.p.s. by the oscillator circuit means will result in a switch repetition rate of 60 c.p.s. by the bistable switch means 40. The values of the capacitors 60 and 61 and the resistors 58 and 59 are also chosen so that the output wave form of the bistable switch means 40, as shown in FIGURE 4, is suited for reliable motor energization and operation. The general principles of the bistable multivibrator are discussed in Wave Generation and Shaping by Leonard Strauss, pages 249–258, published by McGraw-Hill Book Co., Inc., 1960 and Pulse and Digital Circuits by Jacob Millman and Herbert Taub, pages 146–147, 151–156 and 163–164, published by McGraw-Hill Book Co., Inc., 1956. It should be noted that bistable multivibrators are not generally known to be used at switch repetition rates of 60 c.p.s. It is also unusual to utilize commutative or speed-up capacitors and resistors, such as capacitors 60 and 61 and resistors 58 and 59, to switch at a rate slower than the oscillating frequency of the controlling oscillator.

Figure 6:
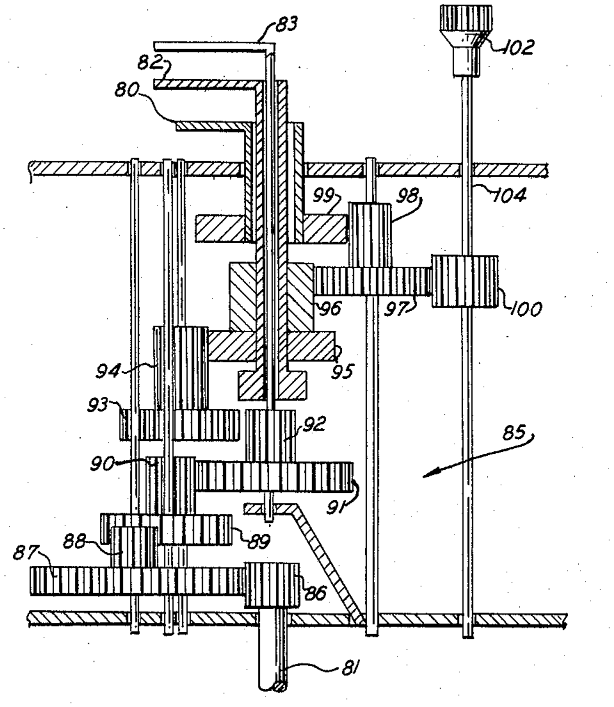
FIGURE 6 is a plan view of the gear train adapted to drive the clock hands.

Referring to FIGURE 6, the output shaft 81 of the motor 70 is connected through three different gear trains (generally referred to as 85) to drive the hour, minute and second hands 80, 82 and 83. The second hand 83 is driven by the motor 70 via a second hand gear train comprising gears 86–91. This gear train has a 400:1 ratio resulting in a complete revolution of the second hand 83 for every 400 revolutions of the motor output shaft 81 which is rotated at 400 r.p.m. The minute hand 82 is driven through the minute hand gear train which includes the gears 86–91 of the second hand gear train and the additional gears 92–95. The additional gears 92–95 have a 60:1 ratio resulting in the minute hand 82, which is attached to the gear 95, completing one revolution each time the second hand completes 60 revolutions. The hour hand 80 is driven via the second hand gear train 86–91, the minute hand gear train 92–95 and the additional gears 96–99. These additional gears 96–99 have a 12:1 ratio resulting in the hour hand 80, that is attached to the gear 99, turning through a complete revolution each time the minute hand completes 12 revolutions.

An adjustment or setting control 102 is connected by a shaft 104 to gear 100. The gear 100 is in turn connected to the hour hand 80, the minute hand 82 and the second hand 83 via the gears 97, 98 and 99; gears 96 and 97; and gears 93–97, respectively. The rotation of the control 102 will rotate the hour, minute and second hands 80, 82 and 83. The specific construction of the gear train is set forth in the following gear data table:

GEAR DATA TABLE

| Wheel Number Number | Number of Teeth | Diametral Pitch | Pitch Diameter | Direction of Rotation |
|---|---|---|---|---|
| 86 | 9 | 85 | .106 | CCW |
| 87 | 60 | 85 | .706 | CW |
| 88 | 8 | 85 | .094 | CW |
| 89 | 60 | 85 | .706 | CCW |
| 90 | 8 | 90 | .089 | CCW |
| 91 | 64 | 90 | .711 | CW |
| 92 | 8 | 85 | .094 | CW |
| 93 | 60 | 85 | .706 | CCW |
| 94 | 8 | 90 | .089 | CCW |
| 95 | 64 | 90 | .711 | CW |
| 96 | 10 | 48 | .208 | CW |
| 97 | 30 | 48 | .625 | CCW |
| 98 | 8 | 48 | .166 | CCW |
| 99 | 32 | 48 | .666 | CW |
| 100 | 10 | 48 | .208 | CW |

It should be understood that it is within the scope of the invention to use alternate mechanical driving means and display arrangements such as a digital clock display with one of the well-known tens transfer mechanisms.

In summary, the above-described electronic clock comprises the combination of an oscillator means 20, a bistable switch means 40 and a motorized drive means 70, 85. The oscillator 20 oscillates at 360 c.p.s. and energizes the bistable switch means 40 which switches at the rate of 60 c.p.s. The bistable switch means 40 energizes the motorized drive means 70, 85 to rotate the clock hands. This combination has the advantages of simplicity, economy and reliability in extreme environmental conditions. Other and more specific advantages are readily apparent from the preceding description.

It should be understood that the phrase "electron devices" as used in the appended claims includes such devices as electron tubes, vacuum tubes, gas tubes, solid state devices, transistor, and semiconductor devices. The phrase "solid state device" includes such device as semiconductor elements, transistors, silicon controlled rectifiers and unijunction transistors.

It will be understood that the invention is not to be limited to the exact construction show and described, but that various changes and modifications may be made without departing from the spirit and scope of the invention as defined in the appended claims.

What is claimed is:

1. In an electronic clock of the type which comprises indicating means, means including a motor for driving said indicating means, a primary frequency source comprising an oscillator arranged to supply an output signal of a selected frequency, and a frequency reduction means arranged to receive said output signal from said oscillator and in response thereto supply, to said means for driving said indicating means, an actuating signal whose frequency is a submultiple of said selected frequency, an improvement characterized in that said frequency reduction means comprises a bistable electronic switch means connected in circuit with said motor for energizing said motor, said bistable switch means constructed to be switched, in response to said output signal, at a rate which is a submultiple of said selected frequency, whereby said motor is arranged to drive said indicating means at a substantially constant speed.

2. In an electronic clock of the type wherein an indicating means is driven by means including a motor and an oscillating means is arranged to supply a given frequency signal to a frequency reduction meanh which is, in turn, arranged to energize said motor at a frequency lower than said given frequency, an improvement characterized in that said frequency reduction means comprises a bistable electronic switch means operatively coupled to said motor and arranged to receive said given frequency signal, said bistable electronic switch means being constructed to switch from one stable condition to the other following a given number of oscillations of said oscillation means, whereby said motor is driven at a constant speed determined by said bistable means.

3. In an electronic clock of the class wherein an oscillator means is arranged to supply a first signal of a given frequency to a frequency dividing means which is, in turn, arranged to supply, in response to said first signal, a second signal of a frequency lower in value than said given frequency to means, including a motor, arranged to drive a clock indicating means, an improvement wherein said frequency dividing means comprises a bistable multivibrator arranged to receive the output signal of said oscillator means and switch its state in response to said first signal, said multivibrator including a pair of cross-coupling circuits, each comprising a commutative capacitor and a resistor proportioned so that said multivibrator switches from one stable state to the other following a given number of oscillations of said oscillating means, whereby said motor is driven at a constant speed by said multivibrator.

4. In an electronic clock of the type comprising an oscillator, a frequency divider, and a clock motor, the combination comprising:

(a) a bistable switch means for energizing said motor and performing frequency division, said bistable switch means comprising a pair of parallel R-C circuits and a pair of transistors having their inputs and outputs interconnected by said R-C circuits, and (b) an electronic oscillator means for switching said bistable switch from one stable condition to another stable condition, said oscillator means connected to the inputs of said transistors and constructed to oscillate at a first given frequency, (c) said R-C circuits of said bistable switch means constructed so that said transistors switch from one stable condition to another stable condition after a given number of oscillations of said oscillating means, whereby said motor is driven at a constant speed determined by said bistable means.

5. In an oscillator-driven electronic clock of the type wherein frequency dividing means are provided for receiving the output signal of said oscillator and for supplying a lower-frequency signal to a clock motor, the combination comprising:

(a) a bistable electronic switch means for energizing said motor, said bistable switch means comprising a pair of R-C coupling circuits, a pair of electron devices, each having an input and an output, the output of each device connected to the input of the other device by one of said R-C circuits, and (b) an electronic oscillator means for switching said bistable switch means from one stable condition to another stable condition, said oscillator means constructed to oscillate at a first frequency, said R-C coupling circuits of said bistable means constructed so that said electron deivces switch from one stable condition to another at a rate lower than the value of said first frequency, whereby said motor is driven at a constant speed determined by said bistable means.

6. The structure defined by claim 5 wherein said oscillator means comprises an electron device having an input and an output, a tuning fork, a drive coil adjacent said tuning fork and connected to said output of said electron device, and a sensing coil also adjacent said tuning fork and connected to said input of said electron device.

7. In combination:

(a) an oscillator means including a solid state device and constructed to oscillate at a first frequency, and (b) a bistable switch means operatively coupled to said oscillator and having two stable states of operation, said bistable switch including R-C cross coupling circuits constructed and arranged so that said multivibrator switches from one stable condition to the other following a given number of oscillations of said oscillator means, whereby said bistable switch means switches from one state to the other at a rate which is a given subharmonic of said first frequency.

8. The structure defined by claim 7 wherein said solid state bistable switch means comprises a first transistor, a second transistor, a first resistor and a first capacitor connected in parallel and connected to the output of said first transistor and connected to the input of said second transistor, and a second resistor and a second capacitor connected in parallel and connected to the output of said second transistor and connected to the input of said first transistor, said first resistor and said first capacitor and said second resistor and said second capacitor proportioned so that the bistable switch means is switched at a subharmonic frequency of said oscillator means.

9. The structure defined by claim 8 wherein the oscillator means comprises a tuning fork, a sensing coil operatively coupled to one tine of said tuning fork, a driving coil operatively coupled to the other tine of said tuning fork and a transistor having its input connected in circuit with said sensing coil and its output connected in circuit with said driving coil and said bistable switch means, whereby the transistor is oscillated at a frequency controlled by the natural frequency of said tuning fork.

References Cited by the Examiner

UNITED STATES PATENTS

| | | | |
|---|---|---|---|
| 2,786,972 | 3/1957 | Dreier et al. | 318—16 |
| 2,976,470 | 3/1961 | Krassoievitch et al. | 318—341 |
| 3,116,466 | 12/1963 | Grib | 331—116 |
| 3,124,733 | 3/1964 | Andrews | 318—138 |
| 3,140,434 | 7/1964 | Hetzel | 318—138 X |
| 3,149,274 | 9/1964 | Hetzel | 318—138 X |

References Cited by the Applicant

Radio Engineers Handbook by Terman (McGraw-Hill, 1943), p. 950.

Scientific American, September 1957, p. 236.

ORIS L. RADER, *Primary Eaxminer.*

JOSEPH A. STRIZAK, *Examiner.*

G. F. BAKER, S. GORDON, *Assistant Examiners.*